(12) United States Patent
Uhnevionak et al.

(10) Patent No.: US 10,636,900 B2
(45) Date of Patent: Apr. 28, 2020

(54) HIGH VOLTAGE TERMINATION STRUCTURE OF A POWER SEMICONDUCTOR DEVICE

(71) Applicant: Infineon Technologies Austria AG, Villach (AT)

(72) Inventors: Viktoryia Uhnevionak, Munich (DE); Philip Christoph Brandt, Oberhaching (DE); Frank Hille, Munich (DE); Alexandra Ludsteck-Pechloff, Unterhaching (DE); Frank Dieter Pfirsch, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/153,041

(22) Filed: Oct. 5, 2018

(65) Prior Publication Data

US 2019/0109230 A1 Apr. 11, 2019

(30) Foreign Application Priority Data

Oct. 6, 2017 (DE) .......................... 10 2017 123 285

(51) Int. Cl.

| | |
|---|---|
| *H01L 29/78* | (2006.01) |
| *H01L 29/40* | (2006.01) |
| *H01L 29/06* | (2006.01) |
| *H01L 29/10* | (2006.01) |
| *H01L 29/417* | (2006.01) |
| *H01L 29/66* | (2006.01) |

(Continued)

(52) U.S. Cl.
CPC ...... *H01L 29/7811* (2013.01); *H01L 29/0619* (2013.01); *H01L 29/0623* (2013.01); *H01L 29/0649* (2013.01); *H01L 29/0696* (2013.01); *H01L 29/1095* (2013.01); *H01L 29/404* (2013.01); *H01L 29/405* (2013.01); *H01L 29/41741* (2013.01); *H01L 29/66712* (2013.01); *H01L 29/7397* (2013.01); *H01L 29/7813* (2013.01); *H01L 29/45* (2013.01); *H01L 29/66348* (2013.01); *H01L 29/66356* (2013.01); *H01L 29/7391* (2013.01); *H01L 29/7396* (2013.01)

(58) Field of Classification Search
CPC .......................... H01L 29/7811; H01L 29/0623
See application file for complete search history.

(56) References Cited

U.S. PATENT DOCUMENTS

| | | | |
|---|---|---|---|
| 5,783,474 A | 7/1998 | Ajit | |
| 2006/0231917 A1* | 10/2006 | Ono | ................... H01L 29/0634 257/500 |

(Continued)

*Primary Examiner* — Farun Lu
(74) *Attorney, Agent, or Firm* — Murphy, Bilak & Homiller, PLLC

(57) ABSTRACT

A power semiconductor transistor includes an electrically conductive contact structure including a plurality of contacts. A first one of the contacts is electrically connected to both a first load terminal and a first zone of a doped semiconductor structure. A second one of the contacts is electrically coupled to one of the first load terminal and a control electrode. The second contact laterally overlaps with both a second zone of the doped semiconductor structure, and a gap is formed between two adjacent field plates. The second zone of the doped semiconductor structure terminates in a section laterally overlapping with the gap.

20 Claims, 6 Drawing Sheets

(51) Int. Cl.
*H01L 29/739* (2006.01)
*H01L 29/45* (2006.01)

(56) References Cited

U.S. PATENT DOCUMENTS

| | | |
|---|---|---|
| 2013/0181328 A1 | 7/2013 | Cao et al. |
| 2014/0284756 A1 | 9/2014 | Ono et al. |
| 2016/0020308 A1* | 1/2016 | Turner ................ H01L 29/402 |
| | | 257/139 |

* cited by examiner

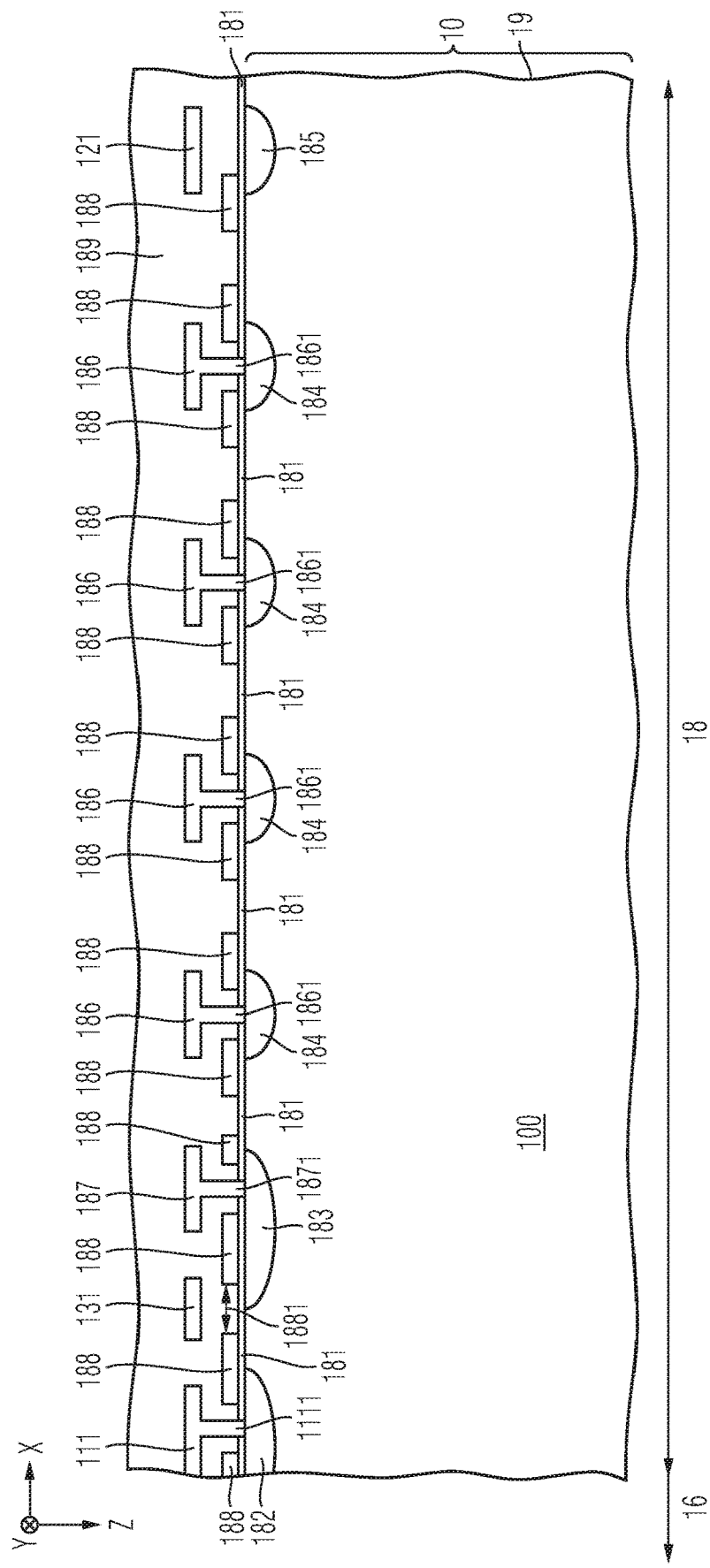

HIGH VOLTAGE TERMINATION STRUCTURE OF A POWER SEMICONDUCTOR DEVICE

TECHNICAL FIELD

This specification refers to embodiments of a power semiconductor transistor and to embodiments of a method of processing a power semiconductor transistor. In particular, this specification relates to embodiments of a high voltage termination structure of a power semiconductor transistor and to embodiments of a method of processing such a high voltage termination structure.

BACKGROUND

Many functions of modern devices in automotive, consumer and industrial applications, such as converting electrical energy and driving an electric motor or an electric machine, rely on power semiconductor devices.

For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a load current along a load current path between two load terminals of the device. Further, the load current path may be controlled by means of an insulated electrode, sometimes referred to as gate electrode. For example, upon receiving a corresponding control signal from, e.g., a driver unit, the control electrode may set the power semiconductor device in one of a conducting state and a blocking state.

Further, for conducting the load current, the power semiconductor device may comprise one or more power cells which may be arranged in a so-called active region of the power semiconductor device. The power semiconductor device may be laterally confined by a chip edge, and between the chip edge and the active region that comprises the one or more power cells, there may be arranged a termination structure.

In terms of power semiconductor devices, such a termination structure is also referred to as a "high voltage termination structure", and it may serve the purpose of supporting the voltage handling capability of the power semiconductor device, e.g., by influencing the course of the electric field within the semiconductor body, e.g., so as to ensure reliable blocking capability of the power semiconductor device.

To this end, the termination structure may comprise one or more components arranged within the semiconductor body, and also one or more components arranged above a surface of the semiconductor body.

SUMMARY

According to an embodiment, a power semiconductor transistor comprises: a semiconductor body coupled to a first load terminal and a second load terminal and including a drift region with dopants of a first conductivity type; an active region having at least one power cell that: extends at least partially into the semiconductor body and comprises at least a section of the drift region; and that is electrically connected with the first load terminal; and that is configured to conduct a load current between said terminals and to block a blocking voltage applied between said terminals; and that is operatively coupled to a control electrode configured to selectively set the at least one power cell into one of a conducting state and a blocking state. The power semiconductor transistor further comprises: a chip edge that laterally terminates the semiconductor body; and an inactive termination structure arranged in between the chip edge and the active region, the termination structure comprising: an insulation structure at least partially covering a surface of the semiconductor body, a doped semiconductor structure arranged in the semiconductor body and having dopants of a second conductivity type complementary to the first conductivity type, the doped semiconductor structure including a plurality of zones, at least a first and a second one of which being arranged separately and electrically insulated from each other, a field plate structure including a plurality of field plates arranged separately from each other, wherein the field plates at least partially overlap laterally with the zones; an electrically conductive contact structure including a plurality of contacts, a first one of which being electrically connected to both the first load terminal and the first zone, a second one of which being electrically coupled to one of the first load terminal and the control electrode, wherein the second contact laterally overlaps with both the second zone and a gap formed between two adjacent ones of said field plates.

According to another embodiment, a method of processing an inactive termination structure of a power semiconductor transistor is presented. The power semiconductor transistor comprises a semiconductor body coupled to a first load terminal and a second load terminal and including a drift region with dopants of a first conductivity type; an active region having at least one power cell that: extends at least partially into the semiconductor body and comprises at least a section of the drift region; and that is electrically connected with the first load terminal; and that is configured to conduct a load current between said terminals and to block a blocking voltage applied between said terminals; and that is operatively coupled to a control electrode configured to selectively set the at least one power cell into one of a conducting state and a blocking state. The transistor further comprises: a chip edge that laterally terminates the semiconductor body; wherein the inactive termination structure is arranged in between the chip edge and the active region. The method comprises: forming an insulation structure at least partially covering a surface of the semiconductor body, forming a doped semiconductor structure arranged in the semiconductor body and having dopants of a second conductivity type complementary to the first conductivity type, the doped semiconductor structure including a plurality of zones, at least a first and a second one of which being arranged separately and electrically insulated from each other, forming a field plate structure including a plurality of field plates arranged separately from each other, wherein the field plates at least partially overlap laterally with the zones; and forming an electrically conductive contact structure including a plurality of contacts, a first one of which being electrically connected to both the first load terminal and the first zone, a second one of which being electrically coupled to one of the first load terminal and the control electrode, wherein the second contact laterally overlaps with each the second zone and a gap formed between two adjacent ones of said field plates.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings:

FIG. 5 schematically and exemplarily illustrates a section of a vertical cross-section of a power semiconductor transistor in accordance with one or more embodiments.

DETAILED DESCRIPTION

Figure 1:
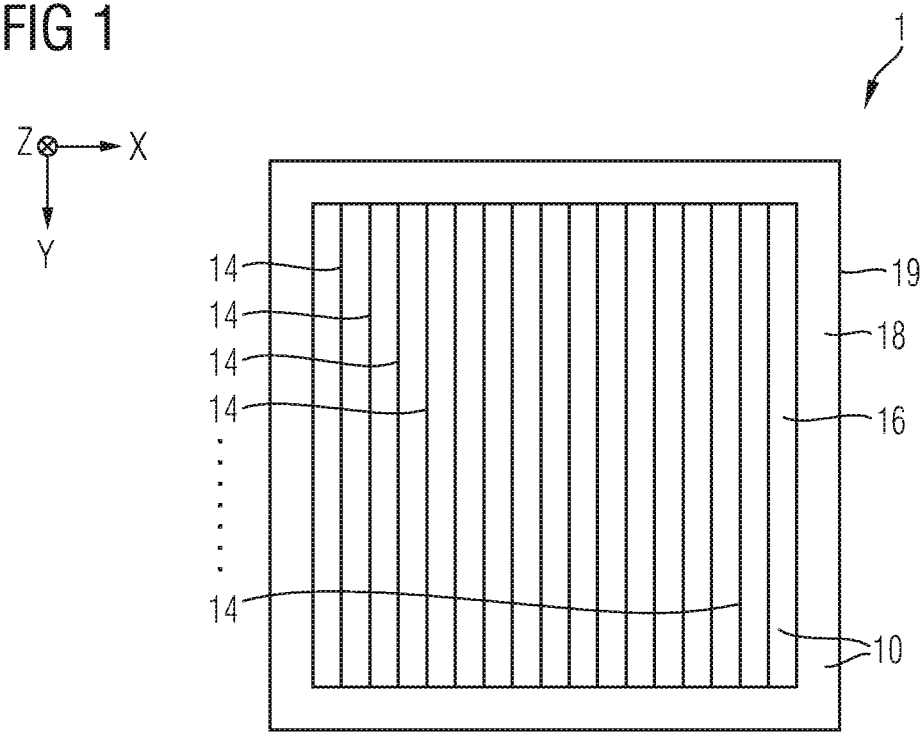
FIGS. 1-2 each schematically and exemplarily illustrate a section of a horizontal projection of a power semiconductor transistor in accordance with some embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "below", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the extension direction Z mentioned below may be an extension direction that is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor transistor exhibiting a stripe cell or cellular cell configuration, e.g., a power semiconductor transistor that may be used within a power converter or a power supply. Thus, in an embodiment, such transistor can be configured to carry a load current that is to be fed to a load and/or, respectively, that is provided by a power source. For example, the semiconductor transistor may comprise one or more active power semiconductor cells, such as a monolithically integrated diode cell, and/or a monolithically integrated transistor cell, and/or a monolithically integrated IGBT cell, and/or a monolithically integrated RC-IGBT cell, and/or a monolithically integrated MOS Gated Diode (MGD) cell, and/or a monolithically integrated MOSFET cell and/or derivatives thereof. Such diode cell and/or such transistor cells may be integrated in a power semiconductor module. A plurality of such cells may constitute a cell field that is arranged with an active region of the power semiconductor transistor.

The term "power semiconductor transistor" as used in this specification intends to describe a semiconductor transistor on a single chip with high voltage blocking and/or high current-carrying capabilities. In other words, such power semiconductor device is intended for high current, typically in the Ampere range, e.g., up to several ten or hundred Ampere, and/or high voltages, typically above 15 V, more typically 100 V and above, e.g., up to at least 400 V.

For example, the power semiconductor transistor described below may be a semiconductor transistor exhibiting a stripe cell configuration or a cellular cell configuration and can be configured to be employed as a power component in a low-, medium- and/or high voltage application.

For example, the term "power semiconductor transistor" as used in this specification is not directed to logic semiconductor devices that are used for, e.g., storing data, computing data and/or other types of semiconductor based data processing.

Figure 2:
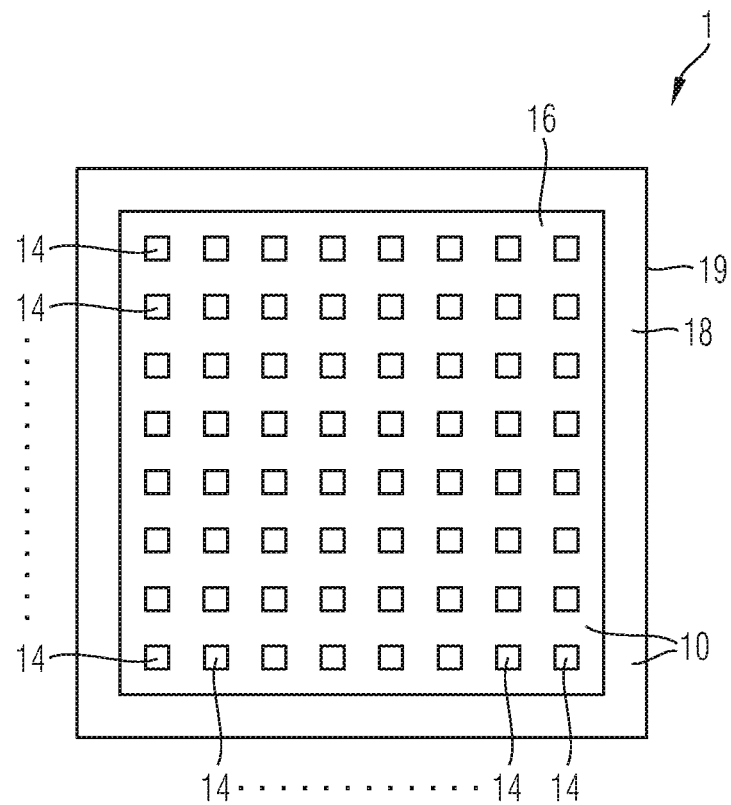
Figure 3:
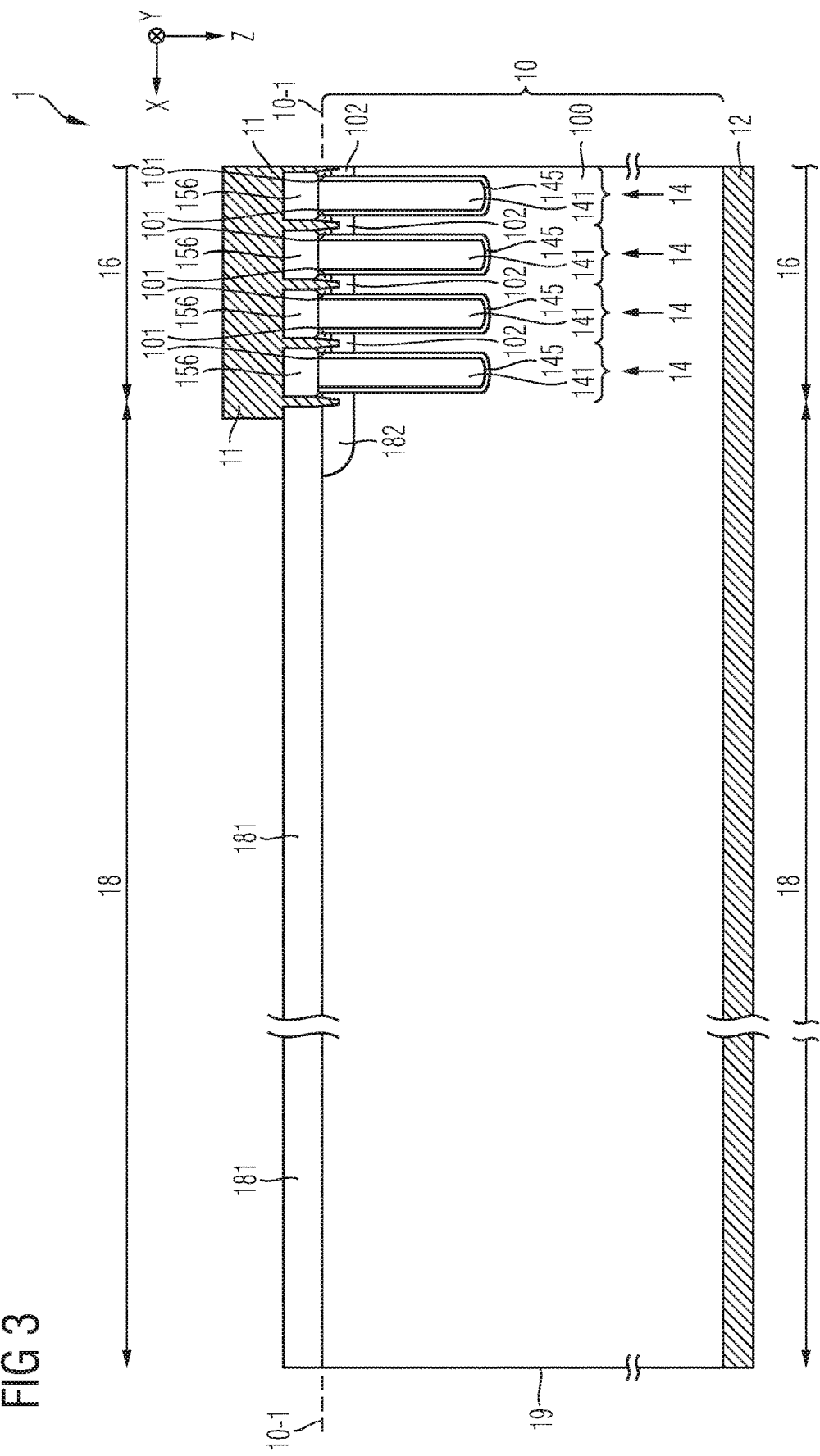
FIG. 3 schematically and exemplarily illustrates a section of a vertical cross-section of a power semiconductor transistor in accordance with one or more embodiments.

FIGS. 1-2 each schematically and exemplarily illustrate a section of a horizontal projection of a power semiconductor transistor 1 in accordance with one or more embodiments. FIG. 3 schematically and exemplarily illustrates a section of a vertical cross-section of a power semiconductor transistor 1 in accordance with one or more embodiments. In the following, it will be referred to each of FIGS. 1-3.

For example, the power semiconductor transistor 1 (in the following also simply referred to as transistor 1) comprises a semiconductor body 10 that is coupled to a first load terminal 11 and a second load terminal 12. For example, the first load terminal 11 may be a source terminal or, respectively, an emitter terminal, whereas the second load terminal 12 may be drain terminal or, respectively, a collector terminal.

In an embodiment, the transistor 1 may exhibit one of an IGBT, an RC-IGBT and a MOSFET configuration or a configuration that is derived from such basic transistor configurations.

The semiconductor body 10 may comprise a drift region 100 with dopants of the first conductivity type. For example, the extension of the drift region 100 along the extension direction Z and its dopant concentration are chosen in dependence of the blocking voltage rating for which the transistor 1 shall be designed, as it is known to the skilled person.

Further, the first load terminal 11 may be arranged on the frontside of the transistor 1 and may include a frontside metallization. The second load terminal 12 may be arranged, opposite to the frontside, on a backside of the transistor 1 and may include, for example, a backside metallization. Accordingly, the transistor 1 may exhibit a vertical configuration. In another embodiment, both the first load terminal 11 and the second load terminal 12 may be arranged on a common side, e.g., both on the frontside, of the transistor 1.

The transistor 1 may further include an active region 16, an inactive termination structure 18 and a chip edge 19. The chip edge 19 may laterally terminate the semiconductor body 10, e.g., the chip edge 19 may have become into being by means of wafer dicing, for example. The inactive termination structure 18 may be arranged between the active region 16 and the chip edge 19, as illustrated in each of FIGS. 1-3. In the present specification, the terms "active region" and "termination structure" are employed in a regular manner, i.e., the active region 16 and the termination structure 18 may be configured to provide for the principle technical functionalities typically associated therewith. For example, the active region 16 of the transistor 1 is configured to conduct the load current between the terminals 11, 12, whereas the termination structure 18 does not conduct the load current, but rather fulfills functions regarding the course of the electric field, ensuring the blocking capability, safely terminating the active region 16 and so forth, in accordance with an embodiment. For example, the termination structure 18 may entirely surround the active region 16, as illustrated in FIGS. 1-2.

The active region 16 may comprise at least one power cell 14. In an embodiment, there are included a plurality of such power cells 14 within the active region 16. The number of power cells may be greater than 100, than 1000, or even greater than 10,000. Each power cell 14 may exhibit a stripe configuration as schematically illustrated in FIG. 1, wherein the total lateral extension in one lateral direction, e.g., along with the second lateral direction Y, of each power cell 14 and its components may substantially correspond to the total extension of the active region 16 along this lateral direction. In another embodiment, each power cell 14 may exhibit a cellular configuration, e.g., as schematically illustrated in FIG. 2, wherein the lateral extensions of each power cell 14 may be substantially smaller than the total lateral extensions of the active region 16. In another embodiment, the active region 16 may include both types of power cells 14.

Each power cell 14 may extend at least partially into the semiconductor body 10 and comprise at least a section of the drift region 100. Further, each power cell 14 may be electrically connected with the first load terminal 11. Each power cell 14 may be configured to conduct a part of the load current between said terminals 11 and 12, and to block a blocking voltage applied between said terminals 11 and 12. For controlling the transistor 1, each power cell 14 may be operatively coupled to or, respectively, comprise a control electrode 141 configured to selectively set the respective power cell 14 into one of the conducting state and the blocking state. The skilled person is aware of many types of configurations that allow for fulfilling such functionality.

Referring to FIG. 3, some exemplary power cells 14 of an outer section of the active region 16 are schematically illustrated. Accordingly, control electrodes 141 may be included in the respective trench 14 and electrically insulated from the semiconductor body 10 by means of a respective insulator 145. Adjacent to the trenches 14, there may be arranged respective source regions 101 with dopants of the first conductivity type, and channel regions 102 with dopants of the second conductivity type, wherein the channel regions 102 may isolate the source regions 101 from the drift region 100. Further, as illustrated in FIG. 3, the source regions 101 and the channel regions 102 may be electrically connected to the first load terminal 11, and the control electrodes 141 may be electrically insulated from the first load terminal 11 by means of respective insulation blocks 156.

However, it should be understood that the present specification is not limited to any kind of a specific configuration of the power cells 14. For example, instead of including the control electrodes 141 in the trenches 14, they could alternatively be provided as planar electrodes arranged above the surface 10-1 of the semiconductor body 10.

The present specification rather focuses on exemplary configurations of the inactive termination structure 18 that is arranged between the chip edge 19 and the active region 16. In each of FIGS. 1-3, however, such exemplary configurations are not entirely illustrated yet.

Still referring to the embodiment of FIG. 3, at a transition between the active region 16 and the inactive termination structure 18, a first semiconductor zone 182 may extend from the active region 16 into the inactive termination structure 18, wherein this first semiconductor zone 182 may comprise dopants of the second conductivity type and may further be electrically connected to the electrical potential of the first load terminal 11.

Also, the first load terminal 11 or, respectively, a conductive component electrically connected thereto, may extend from the active region 16 into the inactive termination structure 18, as schematically illustrated in FIG. 3. Further, the part of the first load terminal 11 (or said component) that extends into the inactive termination structure 18 may laterally overlap with said first semiconductor zone 182, wherein at least an insulation layer 181, e.g., comprising at least one of an oxidation material (e.g. LOCOS (local oxidation of silicon)), a deposited oxide and a silicate glass, may separate said part of the first load terminal 11 (or said component) and the first semiconductor zone 182 along the extension direction Z.

Figure 4A:
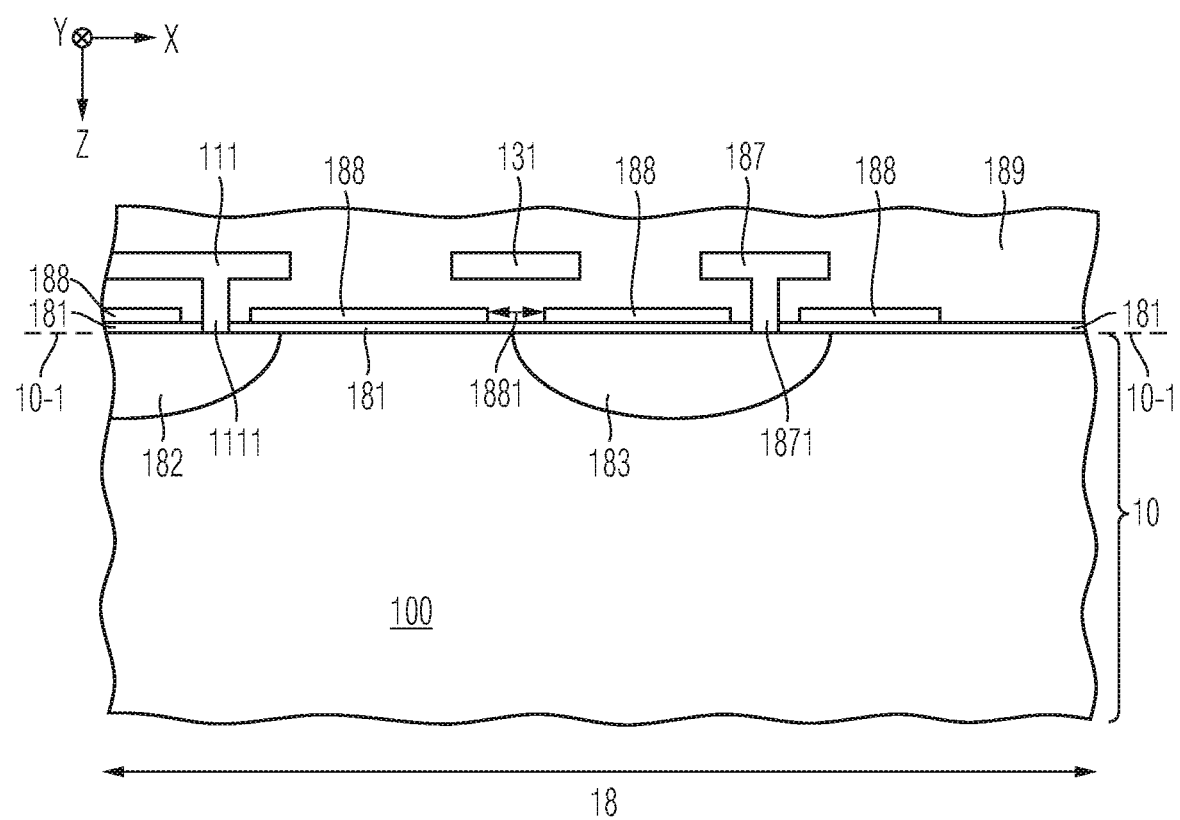
FIGS. 4A-4B each schematically and exemplarily illustrate a section of a vertical cross-section of a power semiconductor transistor in accordance with some embodiments.
Figure 4B:
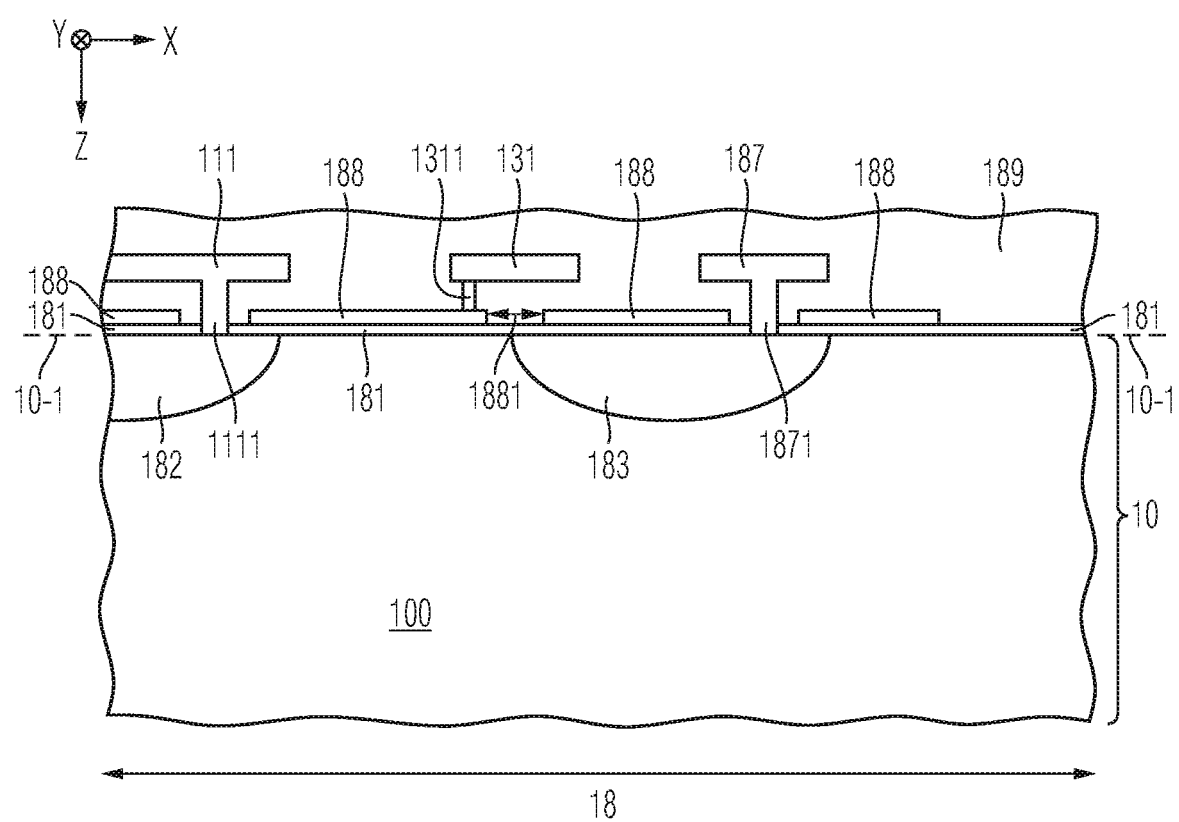

With reference, to each of FIGS. 4A-4B, which both schematically and exemplarily illustrate a section of a vertical cross-section of the power semiconductor transistor 1 in accordance with some embodiments, exemplary aspects of the inactive termination structure 18 shall be described.

For example, the termination structure 18 includes an insulation structure that is at least partially covering the surface 10-1 of the semiconductor body 10. For example, the insulation structure includes at least a part of said insulation layer 181 and an insulation arrangement 189 arranged above the insulation layer 181.

In an embodiment, the insulation layer 181 of the insulation structure may comprise at least one of an oxidation, e.g., LOCOS, a deposited oxide and a silicate glass. Further, the insulation arrangement 189 of the insulation structure may comprise at least one of imide and silicon nitride, and further optionally at least partially also an oxidation and/or deposited oxide and/or a silicate glass. For example, the insulation arrangement 189 may comprise an encapsulation, e.g., an encapsulation made of imide and/or silicon nitride. Thus, in an embodiment, the insulation structure of the termination structure 18 may comprise two or more layers, e.g., a first layer that may be constituted by the insulation layer 181 that may be made of at least one of an oxidation, an oxide and a silicate glass, and that may serve as support for the electrically conductive contact structure. The insulation structure may further comprise a second layer that may be constituted by the insulation arrangement 189 and that may cover the electrically conductive contact structure.

Further, a doped semiconductor structure can be arranged in the semiconductor body 10 and may have dopants of the second conductivity type. The doped semiconductor structure can include a plurality of zones, wherein at least a first zone 182 and a second zone 183 of which are arranged separately and electrically insulated from each other.

For example, the zones 182 and 183 of the doped semiconductor structure extend from the surface 10-1 along the extension direction Z, e.g., for at least some μm, e.g., for at least 2 to 10 μm. The dopant concentration of the first zone 182 may be within the range of 1e16 cm$^{-3}$ to 1e19 cm$^{-3}$ and the dopant concentration of the second zone 183 can be within the range of 1e16 cm$^{-3}$ to 1e19 cm$^{-3}$. The dopant concentration of the first zone 182 and the dopant concentration of the second zone 183 are substantially identical to each other.

Above the surface 10-1, there may be provided a field plate structure including a plurality of field plates 188 arranged separately from each other, wherein the field plates 188 may at least partially overlap laterally with the zones 182 and 183 of the doped semiconductor structure, as illustrated. In an embodiment, each field plate 188 may be made of an electrically conductive material, e.g., made of a poly-crystalline semiconductor material. For example, the field plates 188 are arranged on top of the insulation layer 181. In an embodiment, the field plates 188 are separated from the semiconductor body, e.g., separated from the zones 182 and 183, by means of the insulation layer 181.

In addition, above the surface 10-1, there may further be provided an electrically conductive contact structure including a plurality of contacts, a first contact 111 of which being electrically connected to both the first load terminal 11 and the first zone 182, a second contact 131 of which being electrically coupled to one of the first load terminal 11 and the control electrode 141.

In an embodiment, the second contact 131 may be electrically connected to the first load terminal 11. In another embodiment, the second contact 131 may be electrically coupled to the first load terminal 11, e.g., by means of a connection (not illustrated) having a resistance of at least 1Ω. For example, by means of the electrical potential of the second contact 131, which may be identical to the electrical potential of the field plate 188 to which the second contact 131 may be electrically connected, the voltage blocking capability of the termination structure 18 may be influenced.

In most embodiments, however, the second contact 131 is electrically connected to the control electrode 141. As the control electrode 141 is electrically insulated from the semiconductor body 10, also the second contact 131 is electrically insulated from the semiconductor body 10 in this embodiment. For example, during operation of the transistor 1, the second contact 131 may exhibit a gate voltage, e.g., amounting to 0 V, −8 V or −15 V (with respect to the first load terminal 11). In addition, the second contact 131 may be employed so as to distribute the gate voltage to the control electrodes 141, e.g., as a gate runner or as a gate ring.

In an embodiment, the first contact 111 may form a source runner that at least partially surrounds the active region 16 and exhibits the same electrical potential as the first load terminal 11. For example, the source runner exhibits a substantially longitudinal extension so as to partially or entirely surround the active region 16, e.g., serving as a part of an electrical connection formed between the source regions 101 and an external load terminal (not illustrated), e.g., one or more bond wires configured to carry the load current.

The first contact 111 may be arranged substantially above the field plates 188, and may be electrically connected to the first zone 182 by means of a contact foot 1111 that extends along the extension direction Z so as to penetrate the insulation layer 181 and to interface with the first zone 182, in accordance with an embodiment. At the same time, the first contact 111 may be separated from the field plates 188 by means of said insulation arrangement 189 of the insulation structure, e.g., by an oxide section of the insulation arrangement 189. Due to the electrical connection between the first contact 111 and the first zone 182, the first zone 182 is not electrically floating, but exhibits a defined electrical potential that may be identical to the electrical potential of the first load terminal 11, in accordance with an embodiment.

At some point along the direction towards the chip edge 19, both the first contact 111 and the first zone 182 may terminate. Further along said direction, there can be arranged the second contact 131 and the second zone 183.

In accordance with an embodiment, the second contact 131 laterally overlaps with both the second zone 183 and a gap 1881 formed between two adjacent ones of said field plates 188. As has been explained above, the field plates 188 maybe arranged laterally adjacent to each other and separated from each other. Due to such lateral separation of the field plates 188, respective gaps become into being between two adjacent field plates 188. Each gap may exhibit an extension in parallel to a horizontal direction that points from a center of the active region 16 to the chip edge 19. Accordingly, two adjacent field plates 188 may form said gap 1881, and this gap 1881 may laterally overlap with both the second zone 183 and the second contact 131.

In an embodiment, the second contact 131 forms a gate runner that at least partially surrounds the active region 16 and that is electrically connected to each of the control electrodes 141 for controlling the power cells 14 of the active region 16. For example, similar to the exemplary source runner, the gate runner exhibits a substantially longitudinal extension so as to partially or entirely surround the active region 16, e.g., serving as a part of an electrical connection formed between the control electrodes 141 and an external control terminal (not illustrated), e.g., one or more bond wires configured to provide the control signal.

For example, the electrical potential of the second contact 131 may be at least approximately identical to the electrical potential of the control electrodes 141. For example, the transistor 1 may be electrically coupled to a gate driver (not illustrated) that provides a gate signal to the control electrodes 141, e.g., by applying a voltage between the control electrodes 141 and the first load terminal 11. To this end, the gate runner may be employed. For example, in terms of magnitude, such voltage may be within the range of some Volts, e.g., −20 to 20 Volts, in accordance with an embodiment. Accordingly, such voltage may also be present between the first contact 111 that is electrically connected to the first zone 182 on the one side and the second contact 131 on the other side.

In an embodiment, the second zone 183 is electrically floating. For example, the second zone 183 is not electrically connected to a defined electrical potential, e.g., neither electrically connected to the first load terminal 11, nor to the second load terminal 12, nor to the control electrodes 141.

As has already been mentioned above, in contrast to the first contact 111, the second contact 131 may be electrically insulated from the semiconductor body 10.

In an example, the transistor 1 further comprises a control terminal (not illustrated) electrically connected to the control electrodes 141 of the power cells 14 by means of at least the gate runner. For example, such control terminal may include a gate pad to which said gate driver may be electrically connected, e.g., by means of said one or more bond wires. For example, the gate driver provides the control signal for controlling the transistor 1 by means of applying a control voltage between the control terminal, e.g., at the gate pad, and the first load terminal 11, i.e., by means of applying a control voltage between the second contact 131 and the first contact 111.

In addition to the first contact 111 and the second contact 131, the contact structure of the inactive termination structure 18 may further comprise a third contact 187 that can be electrically connected to the second zone 183. For example, the third contact 187 may also be arranged above the field plates 188 and may interface with the second zone 183 by means of a contact foot 1871 that extends along the extension direction Z and penetrates the insulation layer 181, as illustrated. The third contact 187 may be electrically insulated from the second contact 131. For example, the third contact 187 is electrically floating. In addition, the third contact may be electrically connected to at least one of the field plates 188 arranged adjacent the contact foot 1871. Thus, each of said at least one field plate 188, the third contact 187 and the second zone 183 may be electrically floating.

Said gap 1881 that overlaps with the second contact 131 may exhibit a maximum lateral extension along the horizontal direction that points from the active region 16 to the chip edge 19 of no more than 10 μm. Said gap can be also smaller than 5 μm, or even smaller than 3 μm. Further, the second zone 183 may terminate in a section of the semiconductor body 10 that laterally overlaps with gap 1881, as illustrated. Thus, the second zone 183 may be separated from the first zone 182 by means of the drift region 100 and may begin (or, respectively, terminate) in a section of the semiconductor body 10 that laterally overlaps with gap 1881.

As further illustrated in each of FIGS. 4A and 4B, the gap 1881 between the adjacent field plates 188 can be filled with a part of the insulation structure, e.g., with a section of at least one of the insulation layer 181 and the insulation arrangement 189, e.g., filled by means of an oxide deposition or an oxidation process. Thus, the insulation structure of the termination structure 18 may separate the adjacent field plates 188 that form the gap 1881 from each other.

In an embodiment, the second contact 131 is electrically connected with at least one of the adjacent field plates 188 forming the gap 1881. Such electrical connection can be realized by one or more of several possibilities. For example, the second contact 131 may laterally overlap with at least one of the adjacent field plates 188 forming the gap 1881. For example, the second contact 131 laterally overlaps with both of the adjacent field plates 188 forming the 1881. Further, e.g., as schematically and exemplarily illustrated in FIG. 4B, the termination structure 18 can comprise at least one contact plug 1311 that electrically connects the second contact 131 with at least one of the adjacent field plates 188 forming the gap 1881. In terms of the extension direction Z, the at least one contact plug 1311 may be arranged above the field plates 188 and below the second contact 131. Due to the electrical connection between the at least one field plate 188 and the second contact 131, e.g., established by means of at least the contact plug 1311, both the second contact 131 and the field plate 188 to which it is connected may exhibit the same electrical potential. Thus, in an embodiment, at least one of the adjacent field plates 188 that form the gap 1881 may also be subjected to the control signal that may be provided to the second contact 131. Said at least one field plate 188 may thus exhibit the electrical potential according to the applied gate voltage, in an example. In a further embodiment, the other of the adjacent two field plates 188, e.g., the field plate 188 arranged between the second contact 131 and the third contact 187, may be electrically floating. For realizing the electrical connection between the second contact 131 and the at least one of the adjacent two field plates 188 forming the 1881 by means of said at least one contact plug 1311, it may be appropriate that the second contact 131 laterally overlaps with the at least one field plate 188, as exemplarily illustrated in FIG. 4B.

In an embodiment, the field plate structure is made of a poly-crystalline semiconductor material. Thus, each of the field plates 188 arranged on the insulation layer 181 may be made of a poly-crystalline semiconductor material, e.g., poly-crystalline silicon.

Further, the contact structure can be made of a metal, e.g., aluminium (Al), copper (Cu), aluminium silicon (AlSi) or of a combination thereof, e.g. AlSiCu. Thus, each of the first contact 111, the second contact 131, the third contact 187 and the fourth contacts 186 mentioned for the below can be made of a metal.

As has already been indicated above, in an embodiment, the insulation structure may comprise the insulation layer 181 formed on the semiconductor body surface 10-1 and the insulation arrangement 189 arranged on top thereof, wherein the field plate structure may be arranged on top of the insulation layer 181 and wherein the insulation structure may separate the field plate structure (comprising said field plates 188) from the contact structure (comprising said contacts 111, 131, 187, 186), e.g., by means of at least one of the insulation layer 181 and the insulation arrangement 189. The insulation layer 181 can be a structured insulation layer 181, as will be explained further below.

Now regarding the embodiment of the power semiconductor transistor 1 that is schematically and exemplarily illustrated in FIG. 5, the termination structure 18 may further comprise a guard ring structure.

For example, the guard ring structure includes a plurality of electrically floating third zones 184 of the doped semiconductor structure. As illustrated, the third zones 184 may be formed in the semiconductor body 10. The third zones 184 may comprise dopants of the second conductivity type, e.g., at substantially the same dopant concentration as the second zone 183. In an embodiment, each of the first zone 182, the second zone 183 and the third zones 184 may be produced by means of a common processing step, as will be explained in more detail below.

In an embodiment, each of the first zone 182, the second zone 183 and the third zones 184 may have a common vertical extension range along the extension direction Z of at least 1 µm, of at least 5 µm, or of even more than 8 µm, such as 10 µm, i.e., said zones 182, 183 and 184 may vertically overlap for at least said exemplarily mentioned extensions. For example, each of the first zone 182, the second zone 183 and the third zones 184 may extend from the semiconductor body surface 10-1 for at least 1 µm, for at least 5 µm, or for even more than 8 µm along the extension direction Z. For example, each of the first zone 182, the second zone 183 and the third zones 184 extend from the semiconductor body surface 10-1 for no more than 20 µm, e.g., for no more than 10 µm along the extension direction Z.

For example, the guard ring structure further includes a plurality of fourth contacts 186 that may form a part of the electrically conductive contact structure. Each one of the fourth contacts 186 may be electrically connected to a respective one of the third zones 184 by means of a respective contact foot 1861 that penetrates the insulation layer 181 and interfaces with the semiconductor body 10.

In addition, the guard ring structure may include a plurality of field plates 188 that may form a part of the field plate structure. Also, the field plates 188 of the guard ring structure may be arranged on top of the insulation layer 181 and may laterally overlap with the third zones 184, as illustrated in FIG. 5. Further, each fourth contact 186 electrically connected to a respective third zone 184 may further be electrically connected to at least one of the field plates 188 that laterally overlaps with this third zone 184. Further, each of the third zones 184 may be electrically floating. Thus, in an embodiment, each of the first contact 111, the third contact 187 and the fourth contacts 186 may establish an electrical connection with a respective one of the field plates 188 of the field plate structure. An exception applies, as has been elucidated above, to at least one of the two adjacent field plates 188 that form said gap 1881. One of these adjacent field plates 188 forming the gap 1881, e.g., the one being positioned closer to the active region 16, may be electrically connected to the second contact 131 and may thus be electrically insulated from the semiconductor body.

In an embodiment, along a direction from the active region 16 to the chip edge 19, e.g., along one of the lateral directions X and Y or a linear combination thereof, the zones of the doped semiconductor structure can be arranged in accordance with the following order: the first zone 182 is arranged at a first position, thereafter, the second zone 183 at a second position, and, thereafter, the third zones 184 at third positions, as it is schematically illustrated in FIG. 5.

Thus, in terms of said direction, in an embodiment, the second zone 183 may form the first floating p-ring of the termination structure 18.

Further, in an embodiment, each of the first zone 182, the second zone 183 and the third zones 184 may be separated from each other by means of a section of the semiconductor body 10 that is doped with dopants of the first conductivity type, e.g., by means of respective sections of the drift region 100. In addition, each of the first zone 182, the second zone 183 and the third zones 184 may be arranged so as to at least partially, in an embodiment entirely, surround the active region 16.

For example, a maximum lateral extension of the second zone 183 along a direction from the active region 16 to the chip edge 19, e.g., along one of the lateral directions X and Y or a linear combination thereof, amounts to at least 150% of a maximum lateral extension of the adjacent third zone 184 along this direction. Thus, in an embodiment, the second zone 183 that terminates, as has been elucidated above, in a section of the semiconductor body 10 that laterally overlaps with the gap 1881, may exhibit a greater lateral extension as compared to the third zones 184 of the guard ring structure.

In an embodiment, e.g., as schematically illustrated in each of FIGS. 4A, 4B and 5, the second zone 183 may laterally overlap not only with said gap 1881, but also with the adjacent gap that allows said third contact 187 to interface with the second zone 183. To this end, it may be appropriate that the second zone 183 exhibits a greater lateral extension as compared to the third zones 184 of the guard ring structure.

For example, the positions and spatial dimensions of each of the third zones 184 are chosen such that the third zones 184 only overlap with a gap form between two adjacent field plates 188 that allow the fourth of contact 186 to interface with the third zone 184.

In a further embodiment of the power semiconductor transistor 1, the termination structure 18 comprises a channel stopper structure that can be arranged at an outermost section of the termination structure 18 and that may include a fourth zone 185 of the doped semiconductor structure and a fifth contact 121 of the contact structure, as well as the outermost field plate 188.

In principle, the concept of a guard ring structure and the concept of a channel stopper structure are known to the skilled person and, for this reason, it is refrained from further explaining the purpose and the functionality of these structures.

Figure 6:
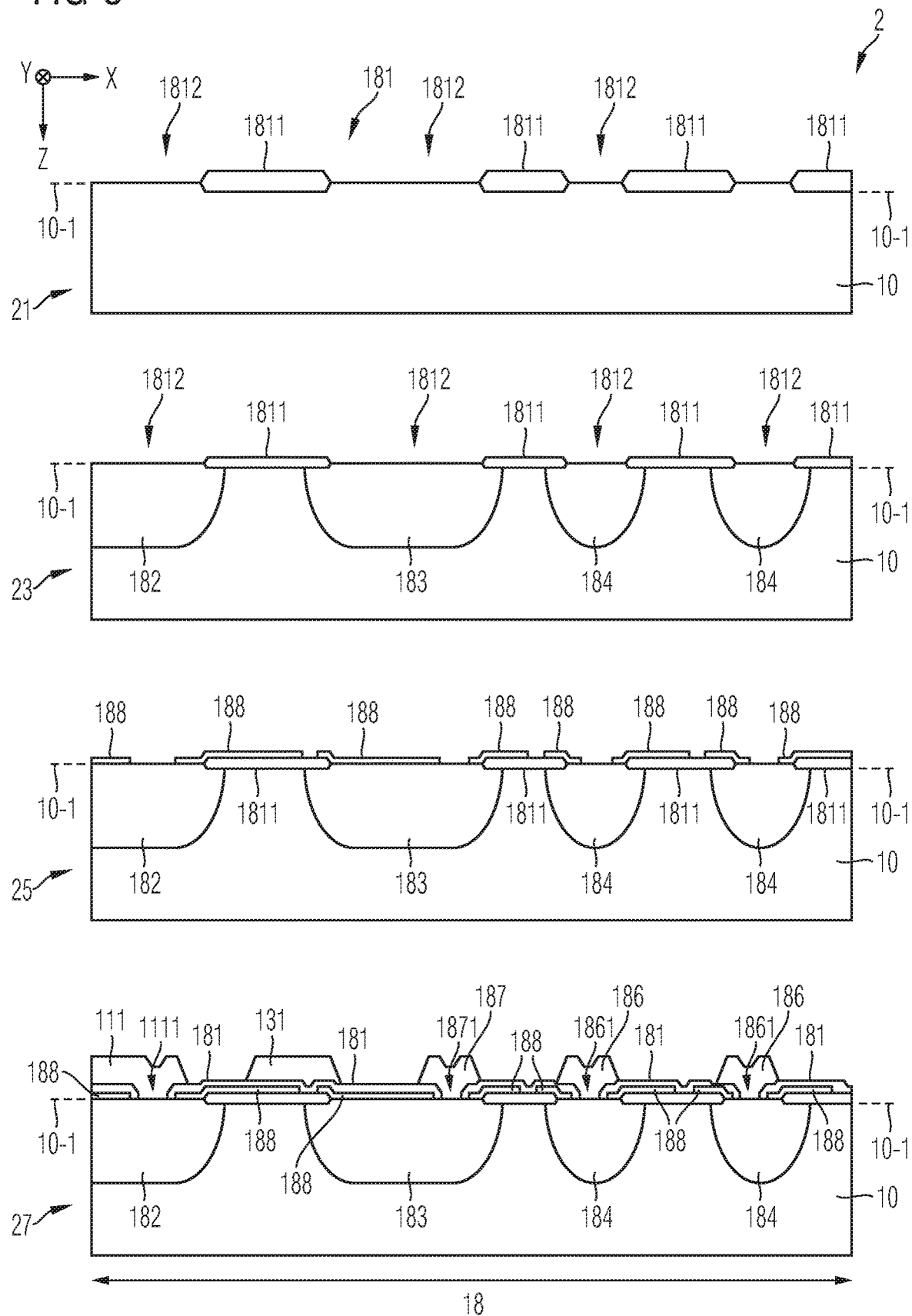
FIG. 6 schematically and exemplarily illustrates steps of a method of processing a power semiconductor transistor in accordance with one or more embodiments.

FIG. 6 schematically and exemplarily illustrates steps of a method 2 of processing a power semiconductor transistor in accordance with one or more embodiments, e.g., a method for producing an embodiment of the inactive termination structure 18 of the power semiconductor transistor 1 as illustrated in the preceding drawings.

For example, in a step 21, the insulation structure, e.g., the insulation layer 181 is formed that at least partially covers the surface 10-1 of the semiconductor body 10. For example, this may be done by carrying out at least one of an oxidation processing step and an oxide depositing step so as to form the insulation layer 181. This may further include structuring the insulation layer 181, e.g., such that the insulation layer 181 exhibits a plurality of insulation elements 1811 and a plurality of recesses 1812, e.g., such that the structured insulation layer 181 may serve as a mask for subsequent processing steps.

Then, in a step 23, the doped semiconductor structure 182, 183, 184 may be formed such that it is arranged in the semiconductor body 10 and has dopants of the second conductivity type complementary to the first conductivity type, the doped semiconductor structure including said plurality of zones 182, 183, 184, wherein at least the first zone 182 and the second zone 183 of which are arranged separately and electrically insulated from each other. As has been explained above, also the third zones 184 may be arranged separately from each other. For example, forming the doped semiconductor structure may be done by carrying out an implantation processing step, e.g., using the structure insulation layer 181 as a mask or using a separate mask, e.g., a resist mask. Thus, in an embodiment, the doped semiconductor structure comprising at least zones 182, 183 and 184 may be produced by means of a self-adjusted processing step.

Then, in step 25, the field plate structure that includes the plurality of field plates 188 can be formed such that the field plates 188 are arranged separately from each other, and such that the field plates 188 at least partially overlap laterally with the zones 182, 183, 184. In contrast to the schematic illustration with respect to step 25 in FIG. 6, the entire semiconductor body surface 10-1 may be covered with thin insulation film, e.g. gate oxide, such that the field plates are indeed not arranged in contact with the doped semiconductor structure 182, 183, 184, but separated from the semiconductor body 10, as has been illustrated in the preceding drawings, e.g., in FIG. 4A-4B and FIG. 5.

Further, in step 27, the electrically conductive contact structure can be formed, the electrically conductive contact structure including the plurality of contacts, the first contact 111 being electrically connected to both the first load terminal 11 and the first zone 182, the second contact 131 being electrically coupled to one of the first load terminal 11 and the control electrode 141, wherein the second contact 131 laterally overlaps with each the second zone 183 and the gap 1881 formed between two adjacent ones of said field plates 188, as has been explained above. Before forming the conductive contact structure including the plurality of contacts, the insulation structure may be increased such that the contact structure is arranged above the field plate structure and separated, by means of the insulation structure, from each of the field plates 188, as has also been explained. Said increase may be realized by means of extending the insulation layer 181, e.g., a LOCOS layer, or, alternatively or additionally, by providing said insulation arrangement 189, as has been explained above. Further, the insulation structure may be structured such that it allows for the first contact 111 to interface with the first zone 182 by means of a contact foot 1111, and such that it allows the third contact 187 to interface with the second zone 183 by means of the contact foot 1871, and such is that it allows the fourth contacts 186 to interface with the respective one of the third zones 184 by means of the respective contact foot 1861.

For example, the insulation structure is provided such that the insulation layer 181 below the field plates 188 exhibits a thickness along the extension direction Z within the range of 200 to 1500 nm, e.g., within the range of 900 to 950 nm.

The exemplary embodiments of the method 2 correspond to the exemplary embodiments of the power semiconductor transistor 1 that have been explained with respect to the preceding drawings. And so far, it is referred to the above.

In the above, embodiments pertaining to power semiconductor transistors and corresponding processing methods were explained. For example, these semiconductor transistors are based on silicon (Si). Accordingly, a monocrystalline semiconductor region or layer, e.g., the semiconductor body 10 and its regions/zones 100, 182, 183, 184 and 185 can be a monocrystalline Si-region or Si-layer. In other embodiments, polycrystalline or amorphous silicon may be employed.

It should, however, be understood that the semiconductor body 10 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A power semiconductor transistor, comprising:
   a semiconductor body coupled to a first load terminal and a second load terminal, and including a drift region with dopants of a first conductivity type;
   an active region having at least one power cell that:
      extends at least partially into the semiconductor body and comprises at least a section of the drift region;
      is electrically connected with the first load terminal;

is configured to conduct a load current between the first and second load terminals, and to block a blocking voltage applied between the first and second load terminals; and is operatively coupled to a control electrode configured to selectively set the at least one power cell into one of a conducting state and a blocking state;

a chip edge that laterally terminates the semiconductor body; and an inactive termination structure arranged in between the chip edge and the active region, the termination structure comprising:

an insulation structure at least partially covering a surface of the semiconductor body;

a doped semiconductor structure arranged in the semiconductor body and having dopants of a second conductivity type complementary to the first conductivity type, the doped semiconductor structure including a plurality of zones, at least a first and a second one of which are located adjacent to each other and arranged separately and electrically insulated from each other;

a field plate structure including a plurality of field plates arranged separately from each other, the field plates at least partially overlapping laterally with the zones;

an electrically conductive contact structure including a plurality of contacts, a first one of which is electrically connected to both the first load terminal and the first zone, and a second one of which is electrically coupled to one of the first load terminal and the control electrode, wherein the second contact laterally overlaps with the second zone, wherein a gap is formed between two adjacent ones of the field plates, wherein the second zone terminates in a section laterally overlapping with the gap.

2. The power semiconductor transistor of claim 1, wherein the second zone is electrically floating.

3. The power semiconductor transistor of claim 2, wherein the second contact is a gate runner electrically connected to the control electrode and electrically insulated from the semiconductor body.

4. The power semiconductor transistor of claim 3, further comprising a control terminal electrically connected to the control electrode by at least the gate runner.

5. The power semiconductor transistor of claim 1, wherein the second contact is electrically connected with at least one of the adjacent field plates forming the gap.

6. The power semiconductor transistor of claim 1, wherein the second contact further laterally overlaps with at least one of the adjacent field plates forming the gap.

7. The power semiconductor transistor of claim 6, wherein the termination structure further comprises at least one contact plug that electrically connects the second contact with at least one of the adjacent field plates forming the gap.

8. The power semiconductor transistor of claim 1, wherein the first contact is a source runner electrically connected to the first load terminal.

9. The power semiconductor transistor of claim 1, wherein the contact structure further comprises a third contact electrically connected to the second zone.

10. The power semiconductor transistor of claim 1, wherein the gap has a maximum lateral extension along a direction from the active region to the chip edge of no more than 10 µm.

11. The power semiconductor transistor of claim 1, wherein the second zone terminates in a section laterally overlapping with gap.

12. The power semiconductor transistor of claim 1, wherein the gap between the adjacent field plates is filled with a part of the insulation structure.

13. The power semiconductor transistor of claim 1, wherein the field plate structure comprises a poly-crystalline semiconductor material.

14. The power semiconductor transistor of claim 1, wherein the contact structure comprises a metal.

15. The power semiconductor transistor of claim 1, wherein the insulation structure comprises an insulation layer formed on the semiconductor body surface and an insulation arrangement, wherein the field plate structure is arranged on top of the insulation layer, and wherein the insulation arrangement separates the field plate structure from the contact structure.

16. The power semiconductor transistor of claim 1, wherein the termination structure further comprises a guard ring structure which includes:

a plurality of electrically floating third zones of the doped semiconductor structure;

a plurality of fourth contacts of the electrically conductive contact structure; and a plurality of field plates of the field plate structure.

17. The power semiconductor transistor of claim 16, wherein, along a direction from the active region to the chip edge, the zones of the doped semiconductor structure are arranged in accordance with the following order: the first zone is arranged at a first position, thereafter, the second zone at a second position, and, thereafter, the third zones at third positions.

18. The power semiconductor transistor of claim 16, wherein a maximum lateral extension of the second zone along a direction from the active region to the chip edge is at least 150% of a maximum lateral extension of the adjacent third zone along the direction.

19. The power semiconductor transistor of claim 1, wherein the termination structure further comprises a channel stopper structure arranged at an outermost section of the termination structure and including a fourth zone of the doped semiconductor structure and a fifth contact of the contact structure.

20. A method of processing an inactive termination structure of a power semiconductor transistor which includes: a semiconductor body coupled to a first load terminal and a second load terminal and including a drift region with dopants of a first conductivity type, an active region having at least one power cell that extends at least partially into the semiconductor body, comprises at least a section of the drift region, that is electrically connected with the first load terminal, that is configured to conduct a load current between the first and second load terminals and to block a blocking voltage applied between the first and second load terminals, and that is operatively coupled to a control electrode configured to selectively set the at least one power cell into one of a conducting state and a blocking state; and a chip edge that laterally terminates the semiconductor body, the inactive termination structure being arranged in between the chip edge and the active region, the method comprising:

forming an insulation structure at least partially covering a surface of the semiconductor body;

forming a doped semiconductor structure arranged in the semiconductor body and having dopants of a second conductivity type complementary to the first conductivity type, the doped semiconductor structure including a plurality of zones, at least a first and a second one of which are located adjacent to each other and arranged separately and electrically insulated from each other;

forming a field plate structure including a plurality of field plates arranged separately from each other, the field plates at least partially overlapping laterally with the zones; and forming an electrically conductive contact structure including a plurality of contacts, a first one of which is electrically connected to both the first load terminal and the first zone, and a second one of which is electrically coupled to one of the first load terminal and the control electrode, wherein the second contact laterally overlaps with the second zone and a gap is formed between two adjacent ones of the field plates.

\* \* \* \* \*